United States Patent [19]
Fukuzumi

[11] Patent Number: 5,910,917
[45] Date of Patent: Jun. 8, 1999

[54] MULTI-CHIP IC MEMORY DEVICE WITH A SINGLE COMMAND CONTROLLER AND SIGNAL CLOCK GENERATOR

[75] Inventor: Tomoya Fukuzumi, Tokyo, Japan

[73] Assignee: Mitsubishi Denki Kabushiki Kaisha, Tokyo, Japan

[21] Appl. No.: 09/139,658

[22] Filed: Aug. 25, 1998

[30] Foreign Application Priority Data

Mar. 25, 1998 [JP] Japan .................................. 10-077178

[51] Int. Cl.⁶ .............................. G11C 16/04; G11C 7/00
[52] U.S. Cl. .............................. 365/185.33; 365/185.29; 365/218
[58] Field of Search ......................... 365/185.29, 185.33, 365/218

[56] References Cited

U.S. PATENT DOCUMENTS

| | | | |
|---|---|---|---|
| 5,568,423 | 10/1996 | Jou et al. ............................ | 365/185.33 |
| 5,572,466 | 11/1996 | Sukegawa ........................... | 365/185.33 |
| 5,621,685 | 4/1997 | Cernea et al. ....................... | 365/185.33 |
| 5,809,515 | 9/1998 | Kaki et al. .......................... | 365/185.33 |
| 5,822,251 | 10/1998 | Bruce et al. ........................ | 365/185.33 |

*Primary Examiner*—Trong Phan
*Attorney, Agent, or Firm*—McDermott, Will & Emery

[57] ABSTRACT

An IC memory device reduces the time required to complete operations for reading, writing, or erasing data continuously from the same sector address in plural memory chips by accomplishing said operations with a single command and sector address input operation. This IC memory device comprises a data control unit, a command control unit, and a serial clock signal generator. The data control unit handles command and data I/O operations between a data bus and the memory chips. The command control unit generates and applies a chip enable signal to each corresponding memory chip based on externally supplied command data. The serial clock signal generator generates an internal serial clock signal supplied to each memory chip based on an externally supplied serial clock signal. Data can thus be read, written, or erased continuously at the same sector address in plural memory chips with the operating command and sector address being input only once.

5 Claims, 12 Drawing Sheets

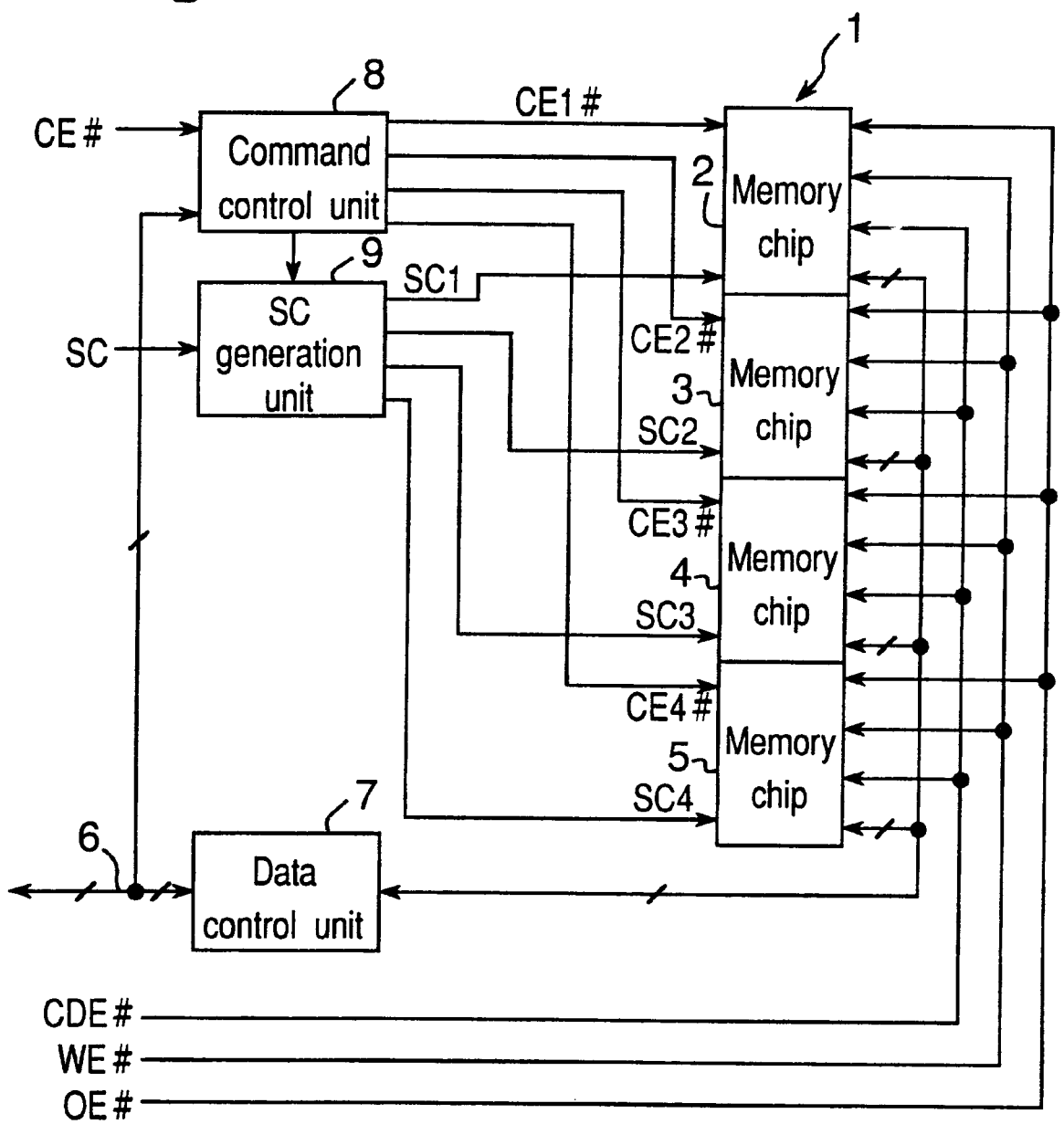

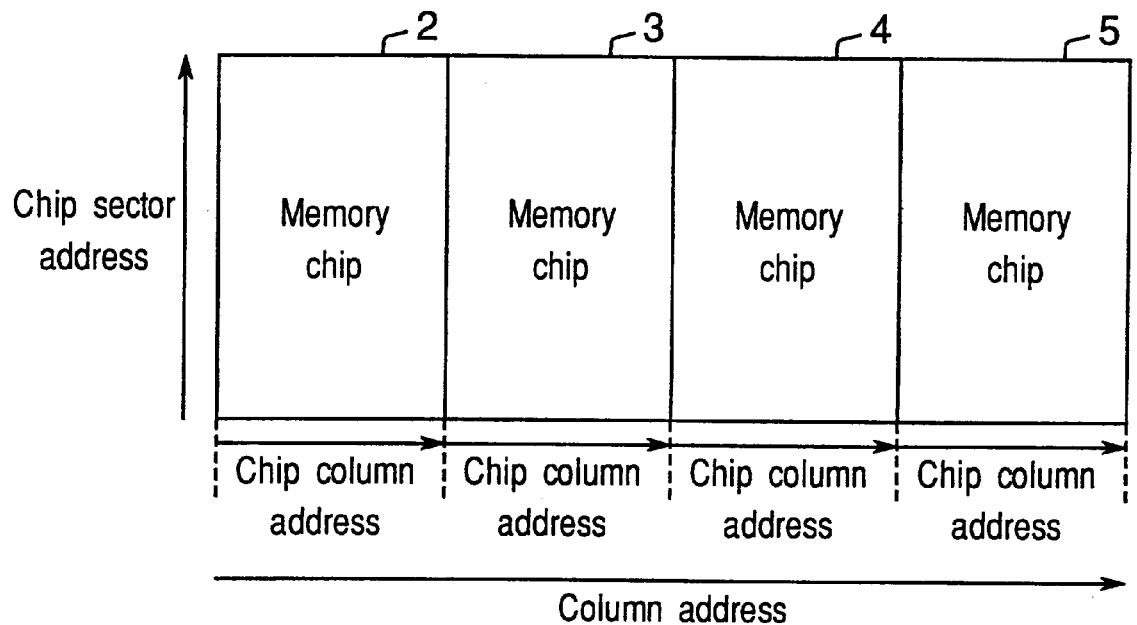

Fig.7

| Sector address (first half) | CSA1 | CSA2 | A0 | A1 | A2 | A3 | A4 | A5 |
|---|---|---|---|---|---|---|---|---|
| Sector address (last half) | A6 | A7 | A8 | A9 | A10 | A11 | A12 | A13 | ns
MULTI-CHIP IC MEMORY DEVICE WITH A SINGLE COMMAND CONTROLLER AND SIGNAL CLOCK GENERATOR

BACKGROUND OF THE INVENTION

1. Field of the Invention

The present invention relates to an IC memory device such as AND flash memory, and relates particularly to an IC memory device such as AND flash memory having a plurality of AND flash memory chips packaged in a single package.

2. Description of the Related Art

FIG. 12 is a typical block diagram of an IC memory device 100 comprising a plurality of AND flash memory chips in a multiple chip package. In the example shown, the IC memory device 100 comprises four AND flash memory chips (simply "memory chips" below) 101–104 packaged in a single AND flash memory device. Each memory chip 101–104 has 528-byte sectors.

Chip enable signals CEa# to CEd#, serial clock signals SCa to SCd, command enable signals CDEa# to CDEd#, write enable signals WEa# to WEd#, and output enable signals OEa# to OEd# are applied respectively to memory chips 101–104. The memory chips 101–104 are also connected to corresponding data buses a to d, which are used for command input and data input/output. It may be apparent that the IC memory device 100 therefore requires sufficient control signal lines and data buses to handle the signal I/O requirements of these four memory chips 101–104. It should be noted that the "#" symbol used above indicates signal level inversion with the corresponding signal being active low.

FIG. 13 is a sequence diagram showing a sequential data read operation from the same sector address in each of the memory chips 101–104 in the above IC memory device 100. As shown in FIG. 13, when an external device applies a read command to the first of the plural memory chips 101–104 in the IC memory device 100, the sector address for the read operation is applied to the addressed memory chip, specifically memory chip 101 in the present example. Because each sector is 528 bytes in this IC memory device 100, data is read sequentially from column address 0 to column address 527 at the specified sector address of the memory chip 101, and output from data bus a.

When a read command for the next memory chip in this group of four memory chips 101–104 is then applied from an external source, the sector address of the read operation is input to memory chip 102. The IC memory device 100 thus reads data sequentially from column address 0 to column address 527 at the specified sector address, and outputs to data bus b. This sequence of steps is simply repeated to read and output data continuously from the same sector address in each of the memory chips 101–104.

The operations for continuously erasing or writing data to the same sector address in each of the memory chips 101–104 are substantially identical to the sequence and process described above except that a write or erase command is applied and the data is written to or erased from the specified column addresses. Further description thereof is thus omitted below.

To sequentially read, write, or erase the same sector address in each of the memory chips 101–104 of a conventional IC memory device comprising a plurality of AND flash memory chips in a multiple chip package, it is therefore necessary to individually apply a specific command and sector address to each of the memory chips 101–104. This need to individually address each of a plurality of memory chips to continuously read, write, or erase the same sector address in each memory chip necessarily increases the total time required for the read, write, or erase operation.

There is therefore a need for an IC memory device whereby the time required to continuously read, write, or erase the same sector address in a plurality of memory chips can be reduced.

SUMMARY OF THE INVENTION

An object of the present invention is therefore to provide an IC memory device whereby the time required to complete a continuous read, write, or erase operation at the same sector address in a plurality of memory chips can be reduced by applying an appropriate command and sector address only once for the plurality of memory chips.

To achieve the above object, an IC memory device according to the present invention comprises a memory unit having a plurality of flash memory chips, a data control unit, a command control unit, and a serial clock signal generator. The data control unit applies command data, address data, and data to be stored to the memory unit received from an external source to each memory chip of the memory unit, and outputs data read from the memory unit to an external device. The command control unit generates a chip enable signal for each memory chip of the memory unit based on externally supplied command data, and applies a chip enable signal to each corresponding memory chip. The serial clock signal generator generates a serial clock signal for each memory chip based on an externally supplied serial clock signal, and supplies an internal serial clock signal to each memory chip in a specific sequence and timing. More specifically, the serial clock signal generator addresses the memory chips of the memory unit in a specific sequence, and applies an internal serial clock signal to the addressed memory chip at a specific pulse count of the externally supplied serial clock signal.

The data control unit in this IC memory device thus handles command and data input output (I/O) between each memory chip and an external source. The command control unit generates a chip enable signal based on a chip enable signal from an external source, and applies the chip enable signal to a memory chip determined according to an externally supplied command. At a specific pulse count of the externally supplied serial clock signal, the serial clock signal generator applies an externally supplied serial clock signal to one of the memory chips selected in a specific sequence.

The serial clock signal generator preferably changes output of a serial clock signal supplied from an external source to another memory chip of the memory unit each time a pulse count of the serial clock signal supplied from an external source reaches a number of bytes of a sector in each memory chip.

The command control unit preferably applies a chip enable signal to enable each memory chip when the command control unit receives from an external source a command for reading, writing, or erasing data continuously at a same sector address in each memory chip of the memory unit.

With each of these configurations, it is only necessary to input the appropriate read, write, or erase command and sector address once in order to continuously read, write, or erase data at the same sector address in each of plural memory chips. The time required to complete data read, write, and erase operations to the same sector address in each of multiple memory chips can therefore be reduced.

When a command for data reading or writing to a single sector address in a memory chip of the memory unit is received by the command control unit, the command control unit further preferably applies a chip enable signal to enable only a memory chip indicated by a sector address supplied from an external source, and informs the serial clock signal generator of the memory chip to read or write. The serial clock signal generator in this case applies a serial clock signal from an external source only to a memory chip indicated by the command control unit.

When a command for deleting data at a single sector address in a memory chip of the memory unit is received from an external source by the command control unit, the command control unit further preferably applies a chip enable signal to enable only a memory chip indicated by a sector address supplied from an external source.

With these configurations, it is also only necessary to input the appropriate read, write, or erase command and sector address once in order to read, write, or erase data at a desired sector address in a memory chip.

BRIEF DESCRIPTION OF THE DRAWINGS

Other objects and attainments together with a fuller understanding of the invention will become apparent and appreciated by referring to the following description and claims taken in conjunction with the accompanying drawings, in which like parts are designated by like reference numeral and in which:

FIG. 1 is a typical block diagram of an IC memory device according to a first embodiment of the present invention;

FIG. 2 is a memory address map of the IC memory device shown in FIG.

FIG. 3 is an example of a sector address input from an external source;

FIG. 7 is an example of a sector address according to a different format input from an external source;

DESCRIPTION OF THE PREFERRED EMBODIMENTS

Figure 4:
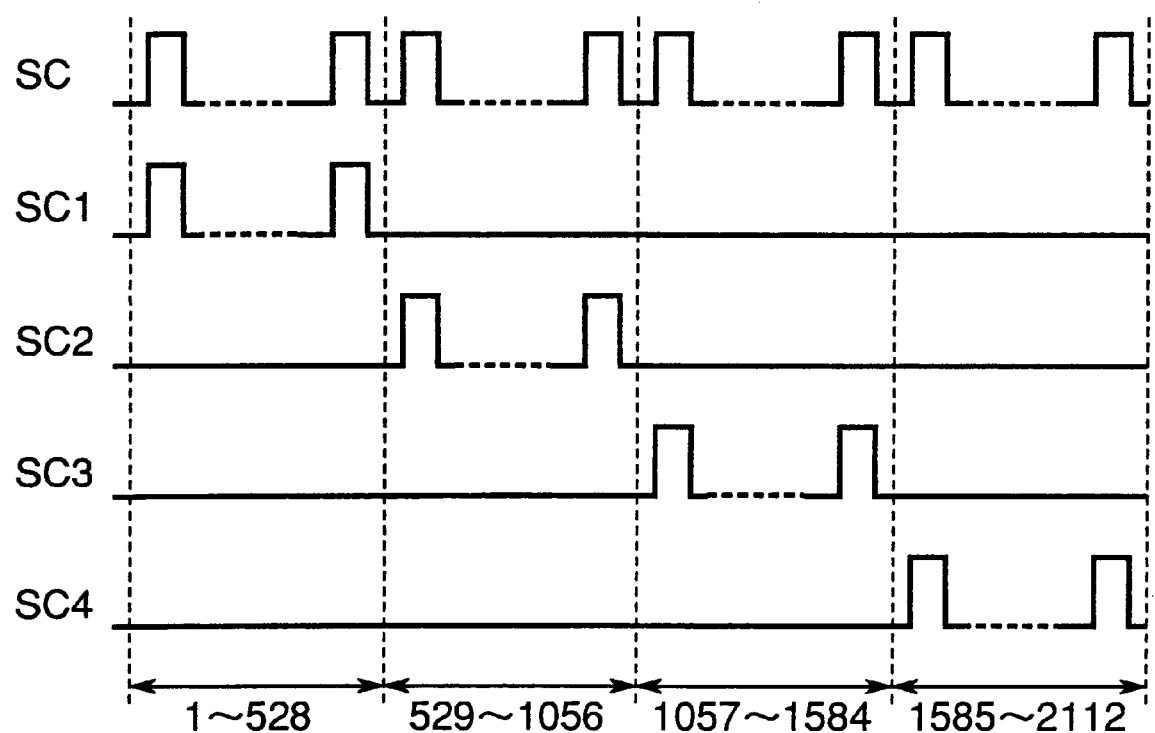
FIG. 4 is a timing chart of the internal serial clock signal output from the serial clock signal generator of the IC memory device shown in FIG. 1.

A preferred embodiment of the present invention is described below with reference to the accompanying figures.

Embodiment 1

An IC memory device according to the present invention is described below using by way of example an AND flash memory device in a multiple chip package. The following exemplary device comprises four AND flash memory chips, referred to as simply memory chips below. Signal flow in this IC memory device is shown in FIG. 1.

As shown in the figure, this IC memory device 1 comprises 64 Mb memory chips 2 to 5, a data control unit 7, a command control unit 8, and a serial clock signal generator 9.

The data control unit 7 controls command and data I/O tasks between the data bus 6 and the memory chips 2 to 5. Based on a command input from the data bus 6, the command control unit 8 generates chip enable signals CE1# to CE4# from the chip enable signal CE# applied from an external source, and supplies a chip enable signal to each memory chip 2 to 5. The serial clock signal generator 9 generates the internal serial clock signals SC1 to SC4 for the memory chips 2 to 5 from a serial clock signal SC supplied from an external source.

A command enable signal CDE#, write enable signal WE#, and output enable signal OE# are input from an external source (not shown) to each of the memory chips 2 to 5. Each of the memory chips 2 to 5 is connected to the data control unit 7, command control unit 8, and serial clock signal generator 9. The data control unit 7 and command control unit 8 are also connected to the data bus 6 by which commands are supplied from an external source and data input and output are accomplished.

The command control unit 8 and serial clock signal generator 9 are further interconnected. A chip enable signal CE# is supplied from an external source to the command control unit 8. A serial clock signal SC is supplied from an external source to the serial clock signal generator 9.

It should be noted that the "#" symbol used herein indicates signal level inversion with the signal being active low.

Commands, address data, and data to be stored to a memory chip are input via the data bus 6 from an external source to the data control unit 7. The data control unit 7 directs the data to the appropriate memory chip 2 to 5, and passes data read from a memory chip to the data bus 6.

When a low chip enable signal CE# and operating command are applied from an external source to the command control unit 8, the command control unit 8 selects the memory chip 2 to 5 indicated by the received command, and enables the selected memory chip by applying thereto the appropriate chip enable signal CE1# to CE4#.

The serial clock signal generator 9 uses a serial clock signal SC applied thereto from an external source to generate internal serial clock signals SC1 to SC4 for the memory chips 2 to 5. Based on the command input thereto from the data bus 6, the command control unit 8 controls the serial clock signal generator 9 to output the internal serial clock signals SC1 to SC4 to the respective memory chip 2 to 5.

FIG. 2 is a memory address map for the four memory chips 2 to 5 of the IC memory device 1 shown in FIG. 1. Each memory chip 2 to 5 is addressed using a sector address and column address sequence where the column address sequence is continuous and the same at the same sector address in each memory chip. This continuous memory chip column address sequence is then also used to determine the column address of the IC memory device 1. For example, sector address 0 in each memory chip 2 to 5 is addressed using column addresses 0 to 527, and this continuous column address sequence is used to determine the column address of sector 0 in the IC memory device 1.

More specifically, sector address 0 of memory chip 2 is addressed using column addresses 0–527, which are also used as column addresses 0–527 of sector address 0 in the IC memory device 1. Sector address 0 of memory chip 3 is likewise addressed using column addresses 0–527, which are in turn used as column addresses 528–1055 of sector address 0 in the IC memory device 1. Sector address 0 in memory chips 4 and 5 is likewise addressed using column addresses 0–527, Which are in turn also used as column addresses 1056–1583 and 1584–2111, respectively, of sector address 0 in the IC memory device 1. As a result, column addresses 0 to 2111 at sector address 0 of the IC memory device 1 can be accessed by accessing the corresponding column address of the appropriate memory chip 2 to 5.

The operation of an IC memory device 1 thus comprised is described next below. It should be noted that the chip enable signal CE#, serial clock signal SC, command enable signal CDE#, write enable signal WE#, and output enable signal OE# supplied to an AND flash memory device from an external source are known from the literature, and further description thereof is thus omitted in the following description of IC memory device 1 operation.

An operation whereby data is read continuously from the same sector address in the memory chips 2 to 5 of an IC memory device 1 according to the present invention is described below.

This operation starts when a continuous read command is applied via the data bus 6 to the data control unit 7 and command control unit 8. This continuous read command requests data be read from the same sector address in each of the memory chips 2 to 5. The command control unit 8 then outputs a low chip enable signal CE1# to CE4# to the corresponding memory chip 2 to 5, and the data control unit 7 passes the received continuous read command to the memory chips 2 to 5.

A sector address is then applied to the data control unit 7 and command control unit 8 via the data bus 6, and the data control unit 7 outputs the sector address to the memory chips 2 to 5. It should be noted here that each of the memory chips 2 to 5 has a 64 Mb storage capacity divided into 16,384 sectors of 528 bytes each. As shown in FIG. 3, the sector address is therefore 14 bits long (A0 to A13) and requires 2 bytes. The first one byte of the sector address holds sector address data A0 to A7 in sequence from the beginning, and the second byte holds sector address data A8 to A13.

The first byte of the sector address data is therefore input to the data control unit 7 and command control unit 8 via the data bus 6, and then the second byte is input. A serial clock signal SC is then supplied to the serial clock signal generator 9 from an external source, and the serial clock signal generator 9 supplies the internal serial clock signals SC1 to SC4 produced from the applied serial clock signal SC to the corresponding memory chip 2 to 5.

FIG. 4 is a timing chart showing the externally supplied serial clock signal SC and the internal serial clock signals SC1 to SC4 output from the serial clock signal generator 9. FIG. 4 is referenced below to describe the operation of the serial clock signal generator 9.

As will be known from FIG. 4, the serial clock signal generator 9 outputs to a specific memory chip 2 to 5 according to the pulse count of the external serial clock signal SC. Thus, the serial clock signal generator 9 passes the external serial clock signal SC as internal serial clock signal SC1 to memory chip 2 only during the period from pulse count 1 to 528. Then, from pulse count 529 to 1056, the serial clock signal generator 9 passes the external serial clock signal SC as internal serial clock signal SC2 to memory chip 3. From pulse count 1057 to 1584, the serial clock signal generator 9 passes the external serial clock signal SC as internal serial clock signal SC3 to memory chip 4, and from pulse count 1585 to 2112 passes the external serial clock signal SC as internal serial clock signal SC4 to memory chip 5.

It is therefore possible to read data continuously from a particular sector address of the IC memory device 1 in response to an external read request by sequentially applying an internal serial clock signal SC to a specific memory chip at a specific timing. Data is thus read from column address 0 to 527 of the IC memory device 1 by applying the internal serial clock signal SC1 to memory chip 2, from column address 527 to 1055 by applying the internal serial clock signal SC2 to memory chip 3, from column address 1056 to 1583 by applying the internal serial clock signal SC3 to memory chip 4, and from column address 1584 to 2111 by applying the internal serial clock signal SC4 to memory chip 5.

Figure 5:
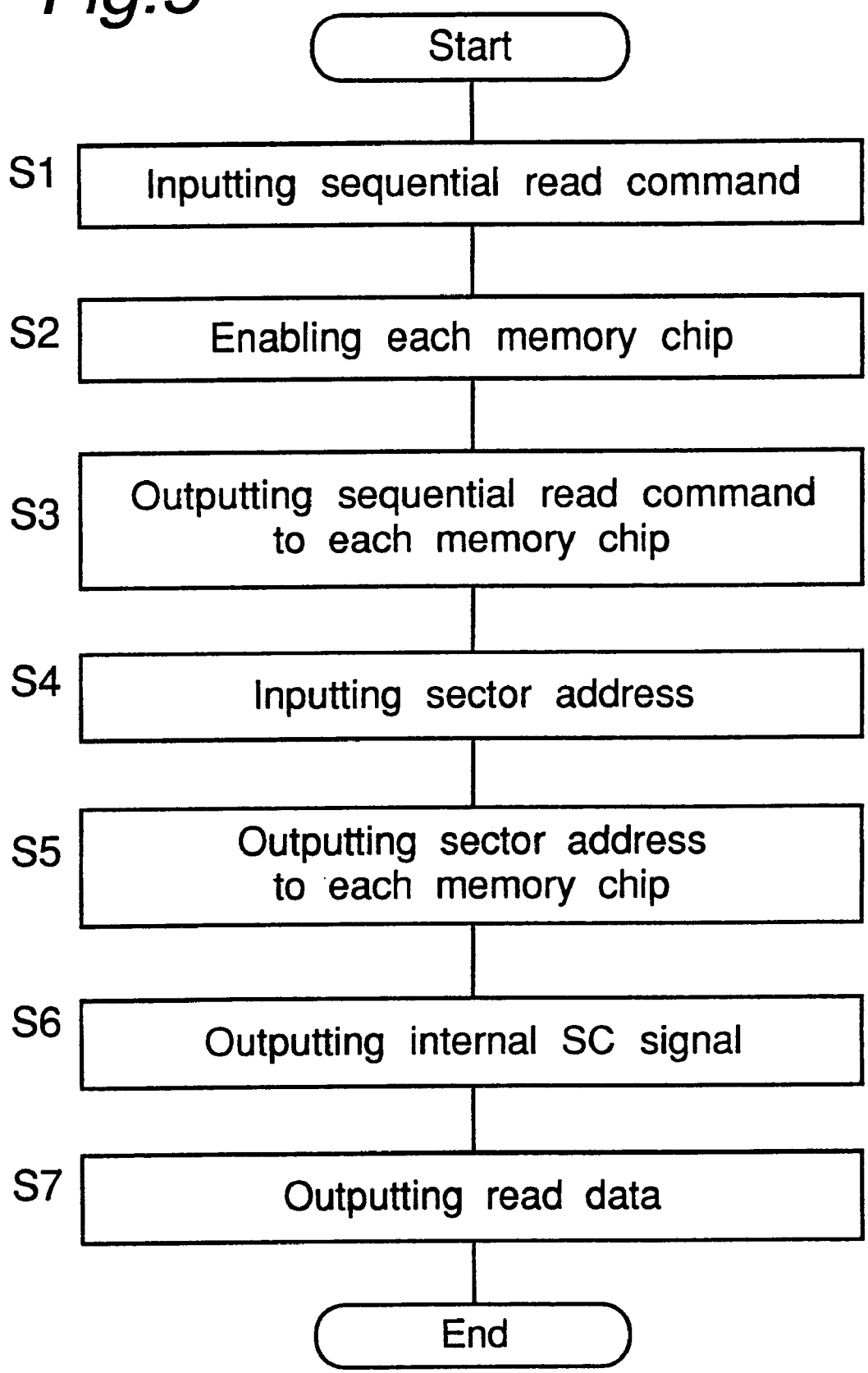
FIG. 5 is a flow chart used to describe a continuous data read operation from the same sector address in each memory chip in the IC memory device shown in FIG. 1.

FIG. 5 is a flow chart referenced below to describe the operation whereby data is read continuously from the same sector address in each memory chip 2 to 5 of the IC memory device 1.

Referring to FIG. 5, operation starts when a continuous read command requesting a data read from continuous sector addresses is applied from an external source to the data control unit 7 and command control unit 8 via the data bus 6 (step S1). The command control unit 8 then supplies low chip enable signals CE1# to CE4# to the corresponding memory chips 2 to 5 (step S2) to enable reading, and the data control unit 7 applies a continuous read command to each of the memory chips 2 to 5 (step S3).

The sector address of the operation is then supplied to the data control unit 7 and command control unit 8 via the data bus 6 from an external source (step S4). The data control unit 7 thus passes the sector address to each of the memory chips 2 to 5 (step S5).

The serial clock signal generator 9 generates the internal serial clock signals SC1 to SC4 based on the external serial clock signal SC supplied thereto, and passes the internal clock signal to the corresponding memory chip 2 to 5 at the appropriate timing (step S6). Data is thus read sequentially from the memory chips 2 to 5, and output through the data control unit 7 to an external device via the data bus 6 (step S7). When all data from the requested sector address has been read and output, the operation ends.

An operation whereby data is read from a desired single sector address in memory chips 2 to 5 is described next with reference to the flow chart thereof shown in FIG. 6.

Figure 6:
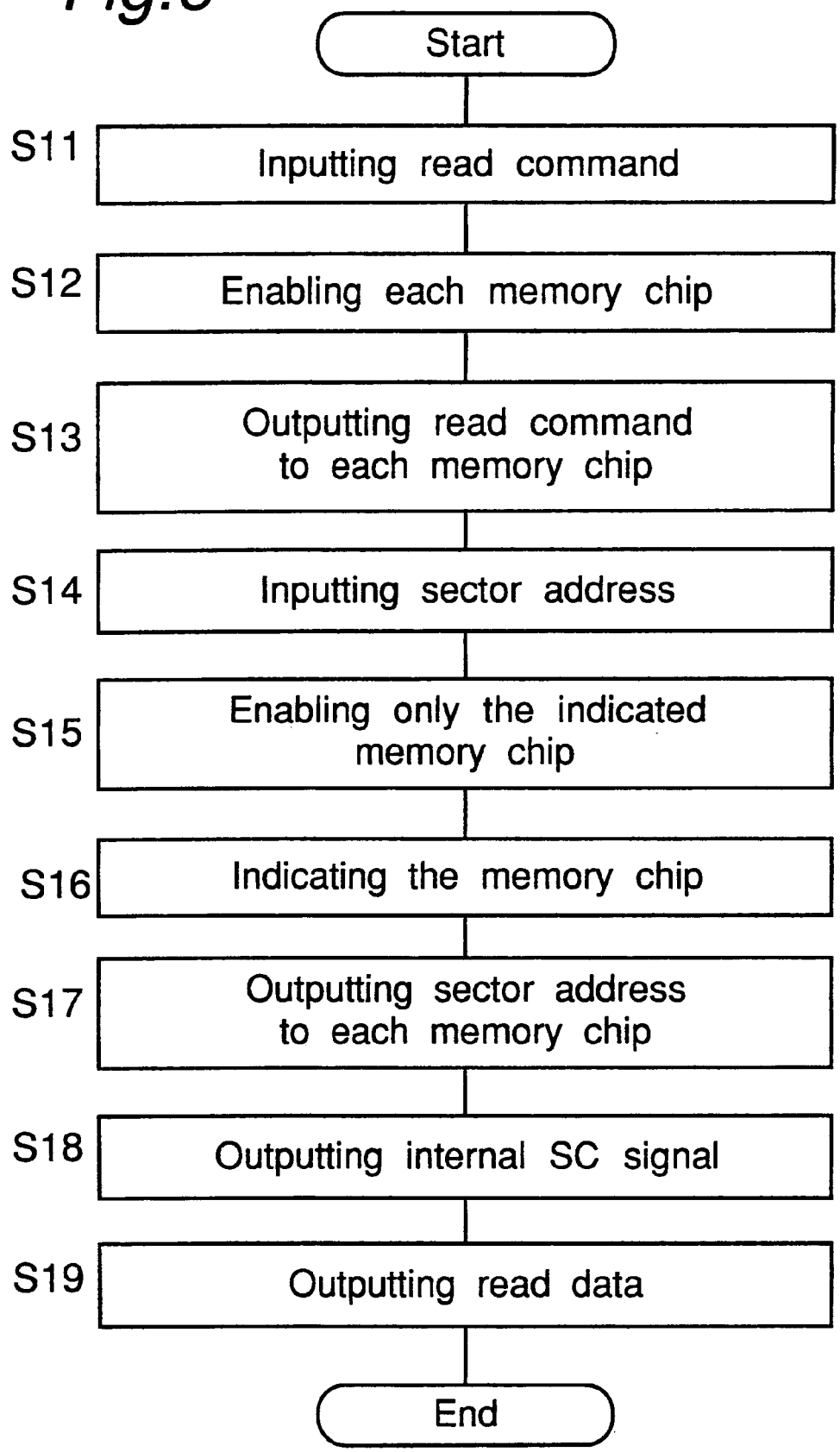
FIG. 6 is a flow chart used to describe a data read operation from a single desired sector address in each memory chip in the IC memory device shown in FIG. 1.

Referring to FIG. 6, operation starts when a read command requesting a data read from a single sector address is applied from an external source to the data control unit 7 and command control unit 8 via the data bus 6 (step S11). The command control unit 8 then supplies low chip enable signals CE1# to CE4# to the corresponding memory chips 2 to 5 (step S12) to enable reading, and the data control unit 7 applies a read command to each of the memory chips 2 to 5 (step S13).

The sector address of the operation is then supplied to the data control unit 7 and command control unit 8 via the data bus 6 from an external source (step S14).

The sector address format used in this case stores a two bit chip selection address to the first two bits of the sector address. This chip selection address determines which memory chip 2 to 5 to select for the operation. As described above, the sector address is 14 bits, A0 to A13, which are preceded in this sector address format by the two chip selection address bits CSA1 and CSA2 as shown in FIG. 7. As shown in FIG. 7, the first byte of the sector address stores the chip selection address bits CSA1 and CSA2 to the first two bits, and fills the remaining 6 bits with sector address bits A0 to A5. The second sector address byte stores the remaining eight sector address bits A6 to A13.

Returning to FIG. 6, the command control unit 8 supplies low chip enable signals CE1# to CE4# only to the memory chips indicated by the chip selection address bits CSA1 and CSA2 to enable reading only from the addressed memory chips. The chip enable signals CE1# to CE4# supplied to the memory chips not addressed are set high to disable the corresponding memory chips (step S15). The command control unit 8 then notifies the serial clock signal generator 9 which memory chips are selected by the chip selection address bits CSA1 and CSA2 (step S16). The data control unit 7 then supplies the received sector address to the selected memory chips 2 to 5 (step S17).

Based on the external serial clock signal SC supplied thereto, the serial clock signal generator 9 generates and passes the internal serial clock signals only to the memory chips indicated by the command control unit 8 (step S18).

Data is thus read sequentially from the addressed memory chips to which the serial clock signal was applied, and output through the data control unit 7 to an external device via the data bus 6 (step S19). When all data from the requested sector address has been read and output, the operation ends.

An operation whereby data is written continuously to the same sector address in memory chips 2 to 5 is described next with reference to the flow chart thereof shown in FIG. 8.

Figure 8:
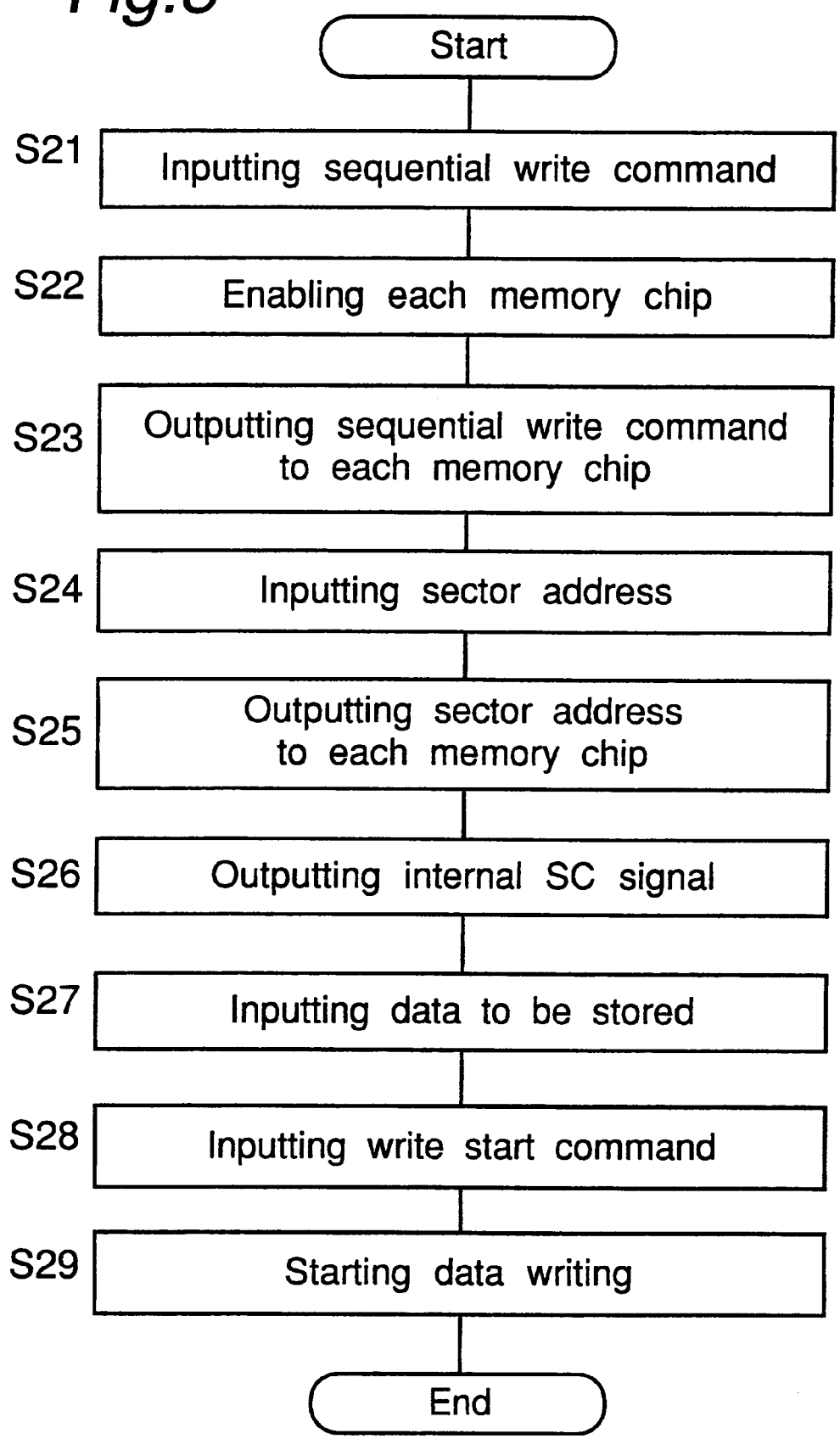
FIG. 8 is a flow chart used to describe a continuous data write operation to the same sector address in each memory chip in the IC memory device shown in FIG. 1.

Referring to FIG. 8, operation starts when a continuous write command requesting a data write to continuous sector addresses is applied from an external source to the data control unit 7 and command control unit 8 via the data bus 6 (step S21). The command control unit 8 then supplies low chip enable signals CE1# to CE4# to the corresponding memory chips 2 to 5 (step S22) to enable writing, and the data control unit 7 applies a continuous write command to each of the memory chips 2 to 5 (step S23).

The sector address of the operation is then supplied to the data control unit 7 and command control unit 8 via the data bus 6 from an external source (step S24). The data control unit 7 thus passes the sector address to each of the memory chips 2 to 5 (step S25).

The serial clock signal generator 9 generates the internal serial clock signals SC1 to SC4 based on the external serial clock signal SC supplied thereto, and passes the internal clock signal to the corresponding memory chip 2 to 5 at the appropriate timing (step S26).

The data to be stored to the memory chips is then input from an external source via the data bus 6 to the data control unit 7, which passes the data to the memory chips 2 to 5 (step S27). A write start command instructing the internal data writing operation of the memory chips to start is then applied via the data bus 6 to the data control unit 7 from an external source (step S28). The data control unit 7 thus applies the write start command to the memory chips 2 to 5 (step S29). When the internal data writing operation is completed, the operation stops.

An operation whereby data is written to a desired single sector address in memory chips 2 to 5 is described next with reference to the flow chart thereof shown in FIG. 9.

Figure 9:
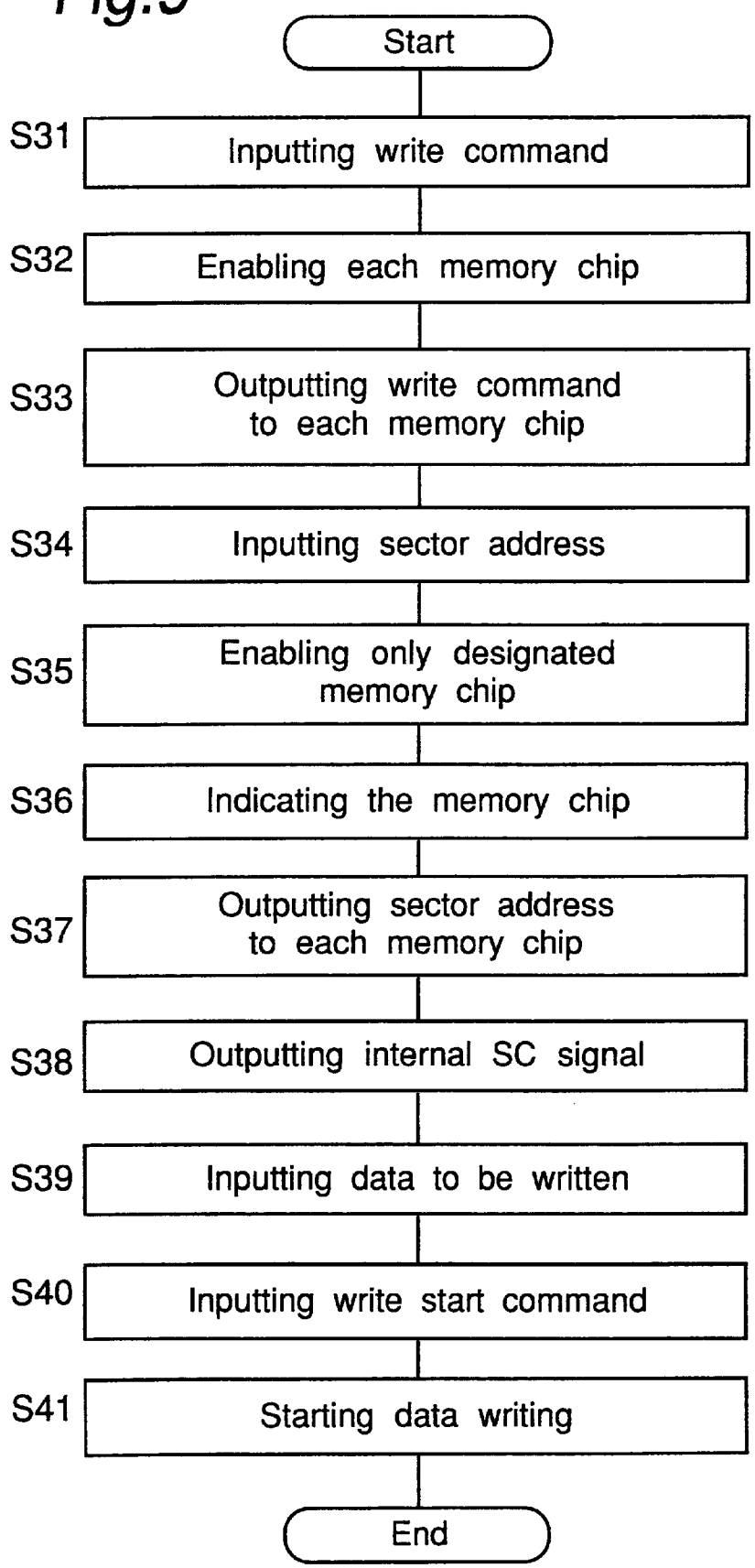
FIG. 9 is a flow chart used to describe a data write operation to a single desired sector address in each memory chip in the IC memory device shown in FIG. 1.

Referring to FIG. 9, operation starts when a write command requesting a data write to a single sector address is applied from an external source to the data control unit 7 and command control unit 8 via the data bus 6 (step S31). The command control unit 8 then supplies low chip enable signals CE1# to CE4# to the corresponding memory chips 2 to 5 (step S32) to enable writing, and the data control unit 7 applies a write command to each of the memory chips 2 to 5 (step S33).

The sector address of the operation is then supplied to the data control unit 7 and command control unit 8 via the data bus 6 from an external source (step S34).

As described in the single sector read operation above, the command control unit 8 supplies low chip enable signals CE1# to CE4# only to the memory chips indicated by the chip selection address bits CSA1 and CSA2 to enable writing only to the addressed memory chips. The chip enable signals CE1# to CE4# supplied to the memory chips not addressed are set high to disable the corresponding memory chips (step S35). The command control unit 8 then notifies the serial clock signal generator 9 which memory chips are selected by the chip selection address bits CSA1 and CSA2 (step S36). The data control unit 7 then supplies the received sector address to the selected memory chips 2 to 5 (step S37).

Based on the external serial clock signal SC supplied thereto, the serial clock signal generator 9 generates and passes the internal serial clock signals only to the memory chips indicated by the command control unit 8 (step S38).

The data to be stored to the memory chips is then input from an external source via the data bus 6 to the data control unit 7, which passes the data to the memory chips 2 to 5 (step S39). A write start command is then applied via the data bus 6 to the data control unit 7 from an external source (step S40). The data control unit 7 thus applies the write start command to the memory chips 2 to 5 (step S41), and the memory chips specified by the chip selection address CSA1 and CSA2 write to the specified sector address. When the internal data writing operation is completed, the operation stops.

An operation whereby data is erased continuously from the same sector address in memory chips 2 to 5 is described next with reference to the flow chart thereof shown in FIG. 10.

Figure 10:
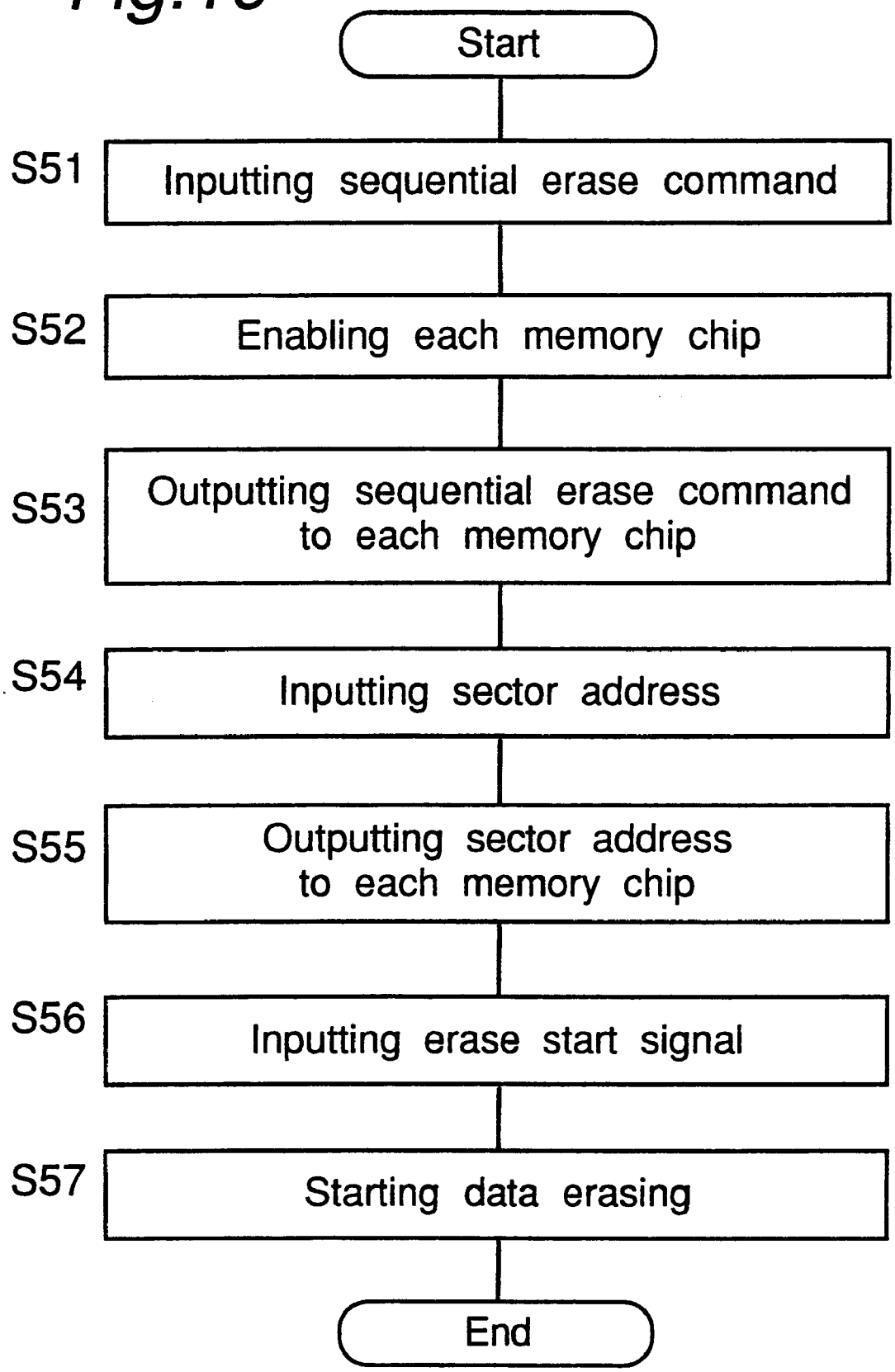
FIG. 10 is a flow chart used to describe a continuous data erase operation at the same sector address in each memory chip in the IC memory device shown in FIG. 1.

Referring to FIG. 10, operation starts when a continuous erase command requesting a deletion of data continuously from an indicated sector addresses is applied from an external source to the data control unit 7 and command control unit 8 via the data bus 6 (step S51). The command control unit 8 then supplies low chip enable signals CE1# to CE4# to the corresponding memory chips 2 to 5 (step S52) to enable operation, and the data control unit 7 applies a continuous erase command to each of the memory chips 2 to 5 (step S53).

The sector address of the operation is then supplied to the data control unit 7 and command control unit 8 via the data bus 6 from an external source (step S54). The data control unit 7 thus passes the sector address to each of the memory chips 2 to 5 (step S55).

An erase start command instructing the internal data erasing operation of the memory chips to start is then applied via the data bus 6 to the data control unit 7 from an external source (step S56). The data control unit 7 thus applies the erase start command to the memory chips 2 to 5 (step S57), and the memory chips 2 to 5 erase data stored to the specified sector address. When the internal erase operation is completed, the operation stops.

Figure 11:
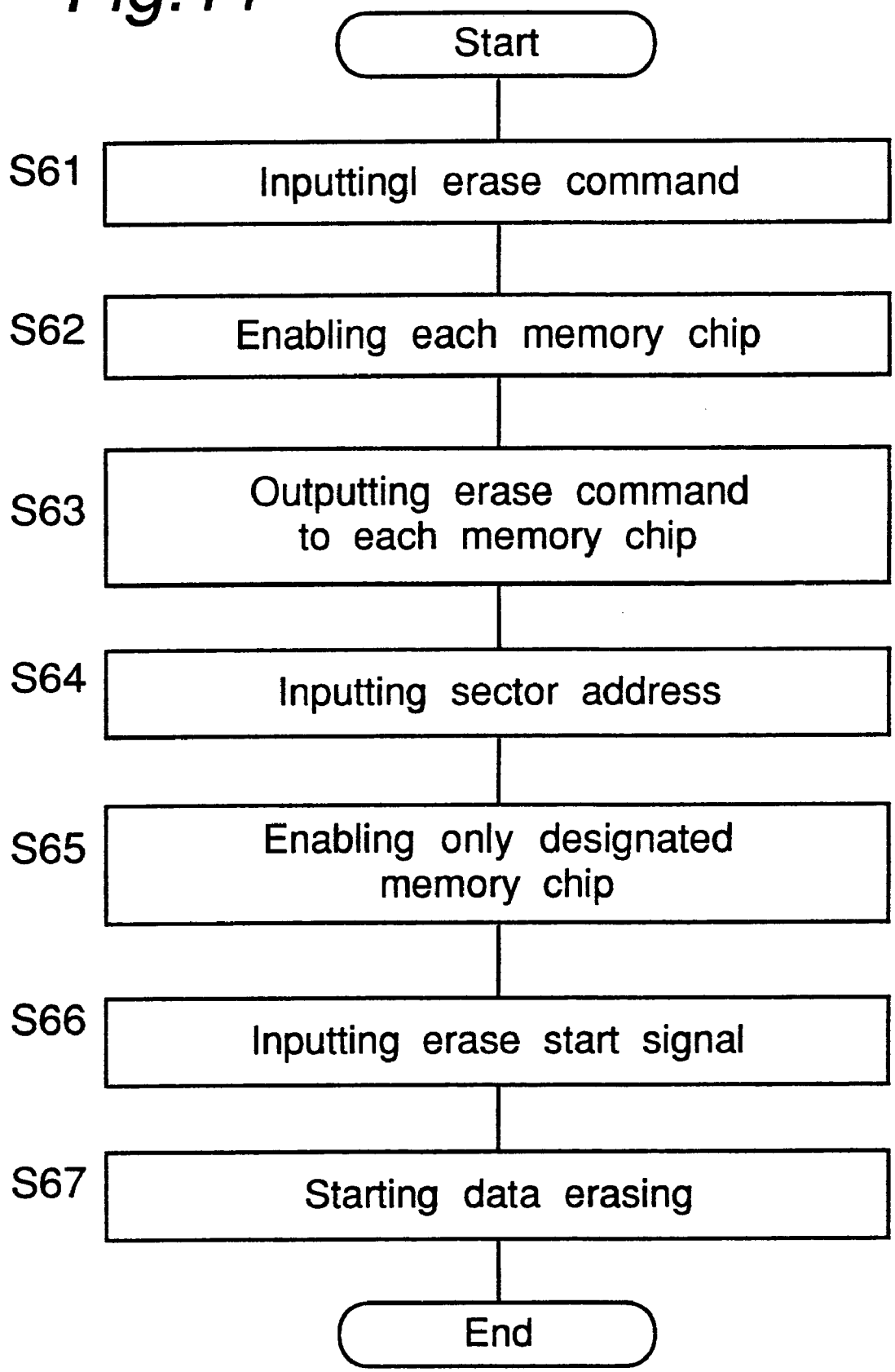
FIG. 11 is a flow chart used to describe a data erase operation at a single desired sector address in each memory chip in the IC memory device shown in FIG. 1.
Figure 12:
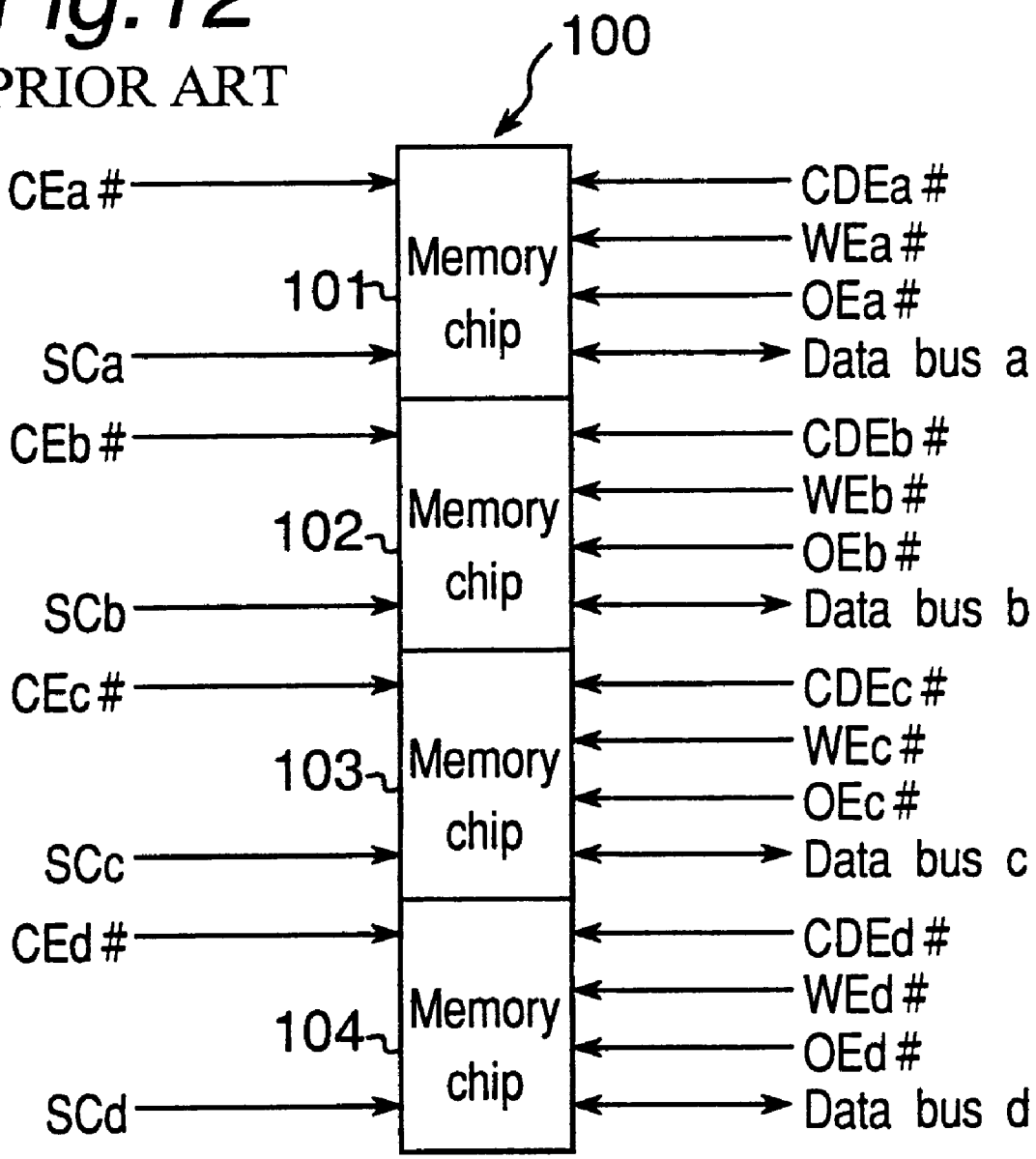
FIG. 12 is a typical block diagram of an AND flash memory device in a multiple chip package exemplary of an IC memory device according to the prior art.
Figure 13:
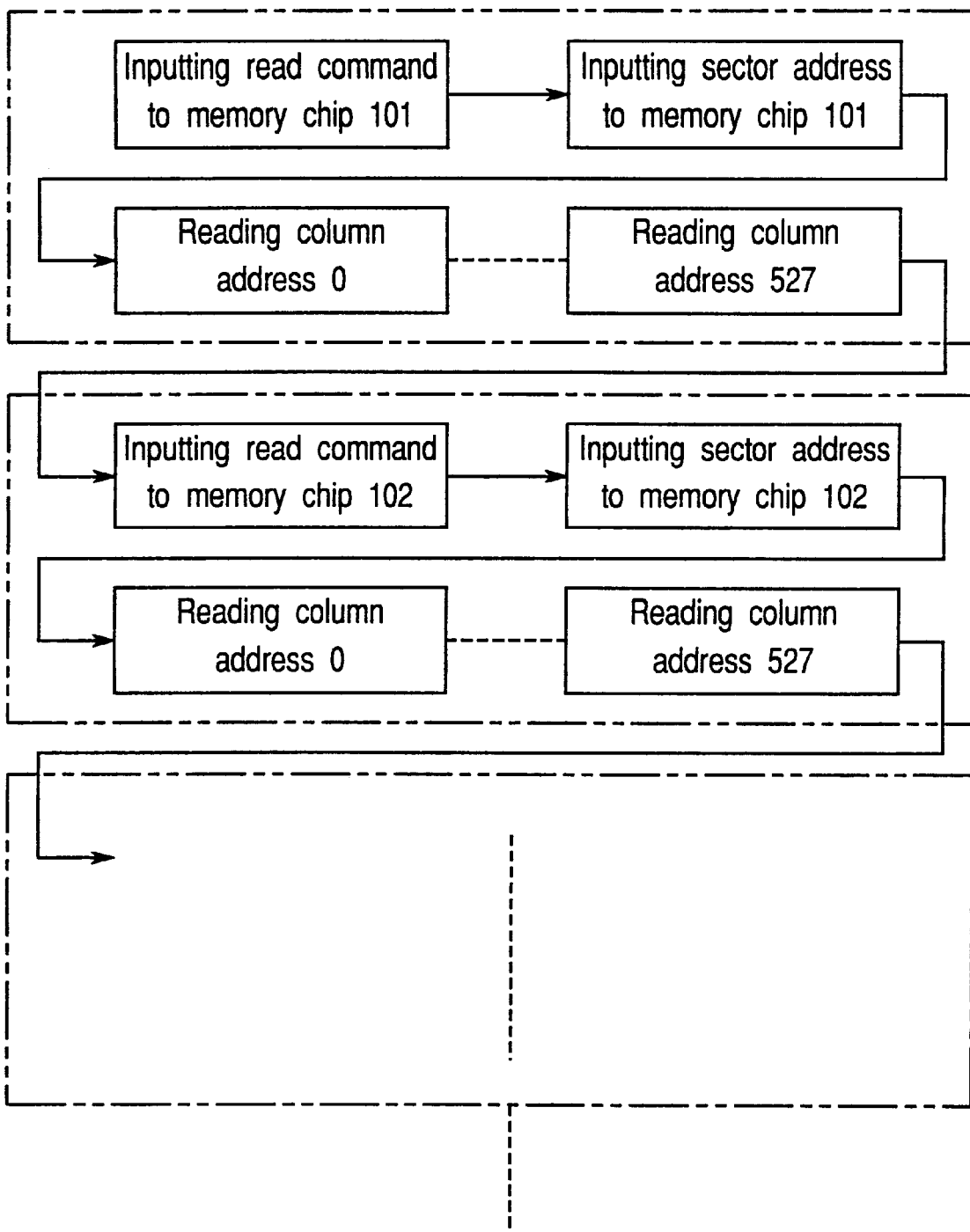
FIG. 13 shows the sequence of a continuous data read operation from the same sector address in each memory chip of the IC memory device shown in FIG. 12.

An operation whereby data is erased from a desired single sector address in memory chips 2 to 5 is described next with reference to the flow chart thereof shown in FIG. 11.

Referring to FIG. 9, operation starts when an erase command requesting deletion of data stored to a single sector address is applied from an external source to the data control unit 7 and command control unit 8 via the data bus 6 (step S61). The command control unit 8 then supplies low chip enable signals CE1# to CE4# to the corresponding memory chips 2 to 5 (step S62) to enable operation, and the data control unit 7 applies an erase command to each of the memory chips 2 to 5 (step S63).

The sector address of the operation is then supplied to the data control unit 7 and command control unit 8 via the data bus 6 from an external source (step S64).

As described above, the command control unit 8 supplies low chip enable signals CE1# to CE4# only to the memory chips indicated by the chip selection address bits CSA1 and CSA2 to enable erasing only the addressed memory chips. The chip enable signals CE1# to CE4# supplied to the memory chips not addressed are set high to disable the corresponding memory chips (step S65).

An erase start command is then applied via the data bus 6 to the data control unit 7 (step S66). The data control unit 7 then supplies the erase start command to the memory chips 2 to 5, and the memory chips addressed by the chip selection address CSA1 and CSA2 delete the data stored to the sector address supplied from the data control unit 7. When data deletion is completed, the operation stops.

As will be known from the above description of an IC memory device according to the present invention, a data control unit 7 handles command and data input/output operations between a data bus 6 and memory chips 2 to 5. In response to a command applied via the data bus 6, a command control unit 8 outputs a chip enable signal CE1# to CE4# to the memory chips 2 to 5 after generating the chip enable signals from an externally supplied chip enable signal CE#. A serial clock signal generator 9 similarly generates internal serial clock signals SC1 to SC4 from an externally supplied serial clock signal SC, and applies the internal clock signals to the respective memory chips 2 to 5.

An IC memory device according to the present invention can thus continuously read, write, or erase data at the same sector address in plural memory chips with a single command and sector address input operation. As a result, an IC memory device according to the present invention meets the need for reducing the time to complete such read, write, and erase operations.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An IC memory device having a plurality of flash memory chips packaged in a multiple chip package, said IC memory device comprising:

a memory unit having a plurality of flash memory chips;

a data control unit for applying to each memory chip of said memory unit externally supplied command data, address data, and data to be stored to a said memory unit, and for outputting data read from said memory unit to an external device;

a command control unit for generating and applying a chip enable signal to each memory chip of said memory unit based on command data from an external source; and a serial clock signal generator for generating a serial clock signal for applying to each memory chip based on an externally supplied serial clock signal;

wherein said serial clock signal generator applies the serial clock signal to either one of the memory chips of said memory unit selectively in a specific sequence at every specific pulse count of the externally supplied serial clock signal.

2. The IC memory device according to claim 1, wherein said serial clock signal generator switches output of a serial clock signal supplied from an external source to another memory chip of said memory unit each time a pulse count of the serial clock signal supplied from an external source reaches a byte number of one sector of each memory chip.

3. The IC memory device according to claim 1, wherein said command control unit applies a chip enable signal to each memory chip when said command control unit receives from an external source a command for reading, writing, or erasing data continuously at a sector having a same sector address in each memory chip of said memory unit.

4. The IC memory device according to claim 1, wherein a chip enable signal, a command signal and sector address information are input to said command control unit, said command control unit applies the input chip enable signal only to a memory chip indicated by the input sector address information and indicates said memory chip to said serial clock signal generator, and said serial clock signal generator;

said serial clock signal generator applies a serial clock signal from an external source only to said memory chip indicated by said command control unit.

5. The IC memory device according to claim 1, wherein said command control unit applies a chip enable signal to enable only a memory chip indicated by a sector address supplied from an external source when a command for deleting data at a single sector address in a memory chip of said memory unit is received from an external source.

\* \* \* \* \*